(12) United States Patent
Chang

(10) Patent No.: US 10,262,726 B1
(45) Date of Patent: Apr. 16, 2019

(54) TRANSPOSE ACCESSING MEMORY DEVICE AND METHOD

(71) Applicant: National Tsing Hua University, Hsinchu (TW)

(72) Inventor: Meng-Fan Chang, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/837,720

(22) Filed: Dec. 11, 2017

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ..... G11C 11/41; G11C 11/419; G11C 29/808; G11C 29/81; G11C 29/848; G11C 7/06; G11C 7/18; G11C 11/1675; G11C 11/405; G11C 11/4076; G11C 11/4091; G11C 11/4094; G11C 16/0483; G11C 16/26; G11C 16/10; G11C 11/161; G11C 11/5628; G11C 16/08; G11C 16/30; G11C 7/22; G11C 8/12; G11C 29/52; G11C 7/12; G11C 11/1673
USPC .............. 365/149, 185.11, 191, 189.15, 148, 365/230.03, 145, 158, 185.02, 185.2, 365/185.27, 185.28, 207, 210.1, 156, 200, 365/230.06, 239, 189.011, 189.16, 222, 365/240, 72, 189.04, 196, 203, 205
See application file for complete search history.

(56) References Cited

U.S. PATENT DOCUMENTS

2009/0316512 A1* 12/2009 Terzioglu ............ G06F 13/4086
365/230.03

* cited by examiner

*Primary Examiner* — Thong Q Le
(74) *Attorney, Agent, or Firm* — Muncy, Geissler, Olds & Lowe, P.C.

(57) ABSTRACT

A transpose accessing memory device is provided, the global word-lines configured to be selected as horizontal word-lines in a row access mode in that at least one row of the memory array is selected to be access, and the corresponding local I/O circuit is configured to guide signals of the local bit-lines coupled to the selected SRAM memory cells to the corresponding horizontal global bit-lines in response to select signals from the global word-lines, and the global word-lines configured to be selected as vertical word-lines in a column access mode in that at least one column of the memory array is selected to be access, and the corresponding local I/O circuit is configured to guide signals of the local bit-lines coupled to the selected SRAM memory cells to the corresponding vertical global bit-lines in response to select signals from the global word-lines.

16 Claims, 21 Drawing Sheets

TRANSPOSE ACCESSING MEMORY DEVICE AND METHOD

BACKGROUND OF THE INVENTION

Field of the Invention

The exemplary embodiment(s) of the present invention relates to a field of transpose accessing memory device and method. More specifically, the exemplary embodiment(s) of the present invention relates to a transpose accessing memory device and method base on hierarchical bit-line structure, which achieves transpose accessing by using local I/O circuits to guide the local bit-lines to the global bit-lines in different directions.

Description of Related Art

Conventional SRAM read array data by row access. For emerging AI neural network algorithms, matrix multiplication in computer graphics and some data processing method in 2D image processing, access stored data by column access can reduce design/operation complexity of the above mentioned application.

Previous arts regarding transpose memory in hardware level is not area-efficient and support large memory capacity. Conventionally, if the data stored in a column is needed, the series of rows have to be read, that is, all rows have to be read to obtain data of the column. Therefore, more power and time consumption are needed.

Other previous arts designed for transpose accessing modified the design of the memory cell, while affecting stabilities and yield thereof. Furthermore, under the consideration of yield, these designs are usually discarded by the manufacturer. Therefore, a new SRAM memory architecture for transpose accessing that may utilize the traditional memory cell design, while achieve energy-saving, time-saving and area-efficient characteristics is needed.

SUMMARY OF THE INVENTION

According to an aspect of the present application, a transpose accessing memory device is disclosed. The transpose accessing memory includes a plurality of groups of SRAM memory cells arranged as a memory array, a plurality of local bit-lines coupled to the SRAM memory cells of each group of the plurality of groups, a plurality of local I/O circuits each coupled to one group of the plurality of local bit-lines in each row of the memory array, a plurality of global word-lines each coupled to a first end of each of the plurality of local I/O circuits, respectively, a plurality of horizontal global bit-lines each coupled to a second end of each of the plurality of local I/O circuits, respectively, and a plurality of vertical global bit-lines coupled to a third end of each of the plurality of local I/O, respectively. The global word-lines configured to be selected as horizontal word-lines in a row access mode in that at least one row of the memory array is selected to be access, and the corresponding local I/O circuit is configured to guide signals of the local bit-lines coupled to the selected SRAM memory cells to the corresponding horizontal global bit-lines in response to select signals from the global word-lines, and the global word-lines configured to be selected as vertical word-lines in a column access mode in that at least one column of the memory array is selected to be access, and the corresponding local I/O circuit is configured to guide signals of the local bit-lines coupled to the selected SRAM memory cells to the corresponding vertical global bit-lines in response to select signals from the global word-lines.

According to another aspect of the present application, a transpose accessing method for a memory device is provided. The method includes the following steps: applying a predetermined command indicating that one row of a memory array of a memory device described above to be access in a row access mode, or one column of a memory array of a memory device to be access in a column access mode. If at least one row of the memory array is selected to be access in the row access mode, further includes the following steps: selecting the global word-lines corresponded to the selected row as horizontal global word-lines; providing select signals to the global word-lines corresponded to the selected row; and configuring the corresponding local I/O circuit to guide signals of the corresponding local bit-lines coupled to the selected SRAM memory cells to the corresponding horizontal global bit-lines in response to the select signals from the global word-lines. If at least one column of the memory array is selected to be access in the column access mode, further comprising the following steps: selecting the global word-lines corresponded to the selected column as vertical global word-lines; providing select signals to the global word-lines corresponded to the selected column; and configuring the corresponding local I/O circuit to guide signals of the corresponding local bit-lines coupled to the selected SRAM memory cells to the corresponding vertical global bit-lines in response to the select signals from the global word-lines.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

Exemplary embodiments of the present invention are described herein in the context of a transpose accessing memory device and method.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Figure 1:
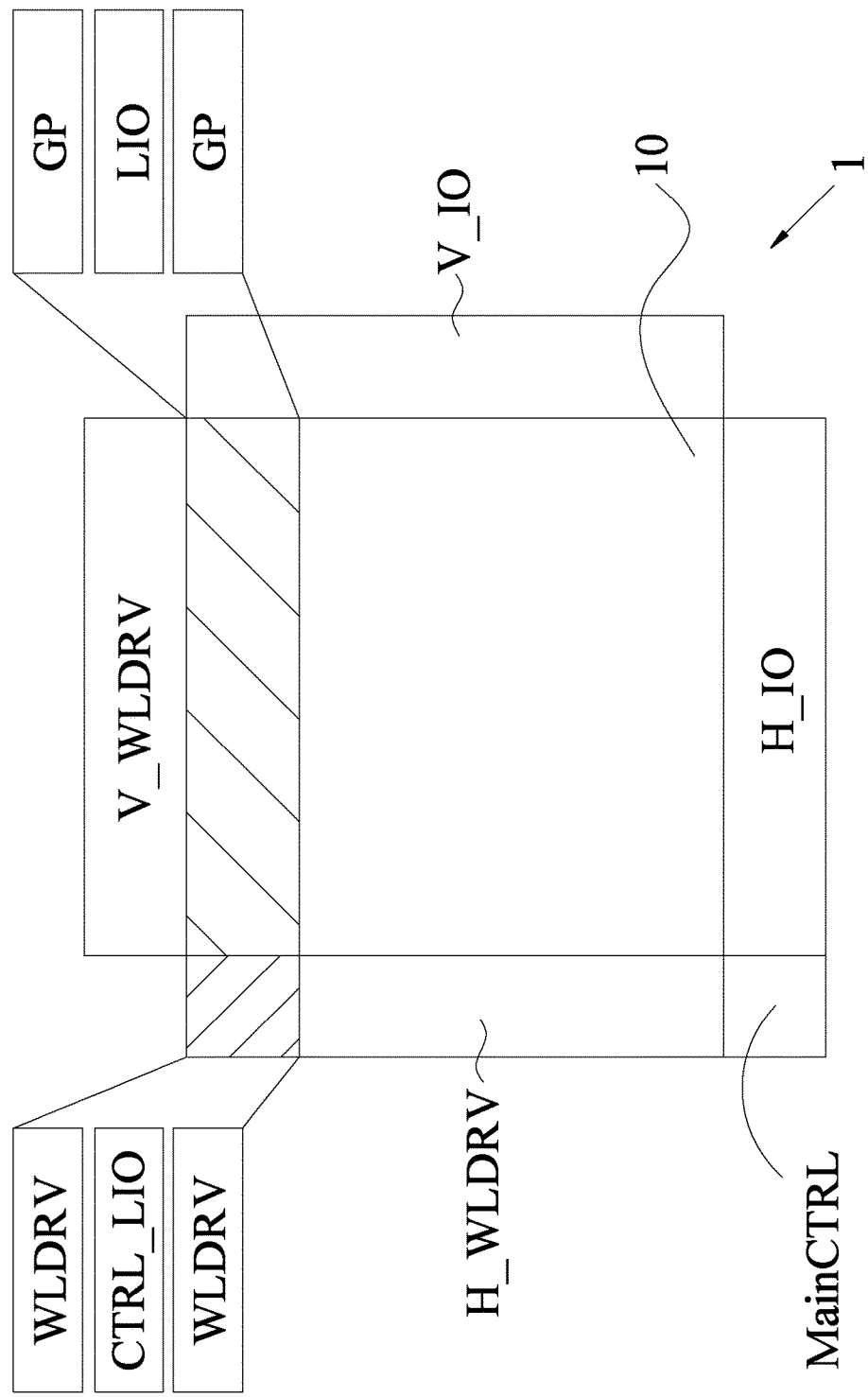
FIG. 1 is a diagram showing an entire configuration of a transpose accessing memory device of an embodiment according to the present application.
Figure 2:
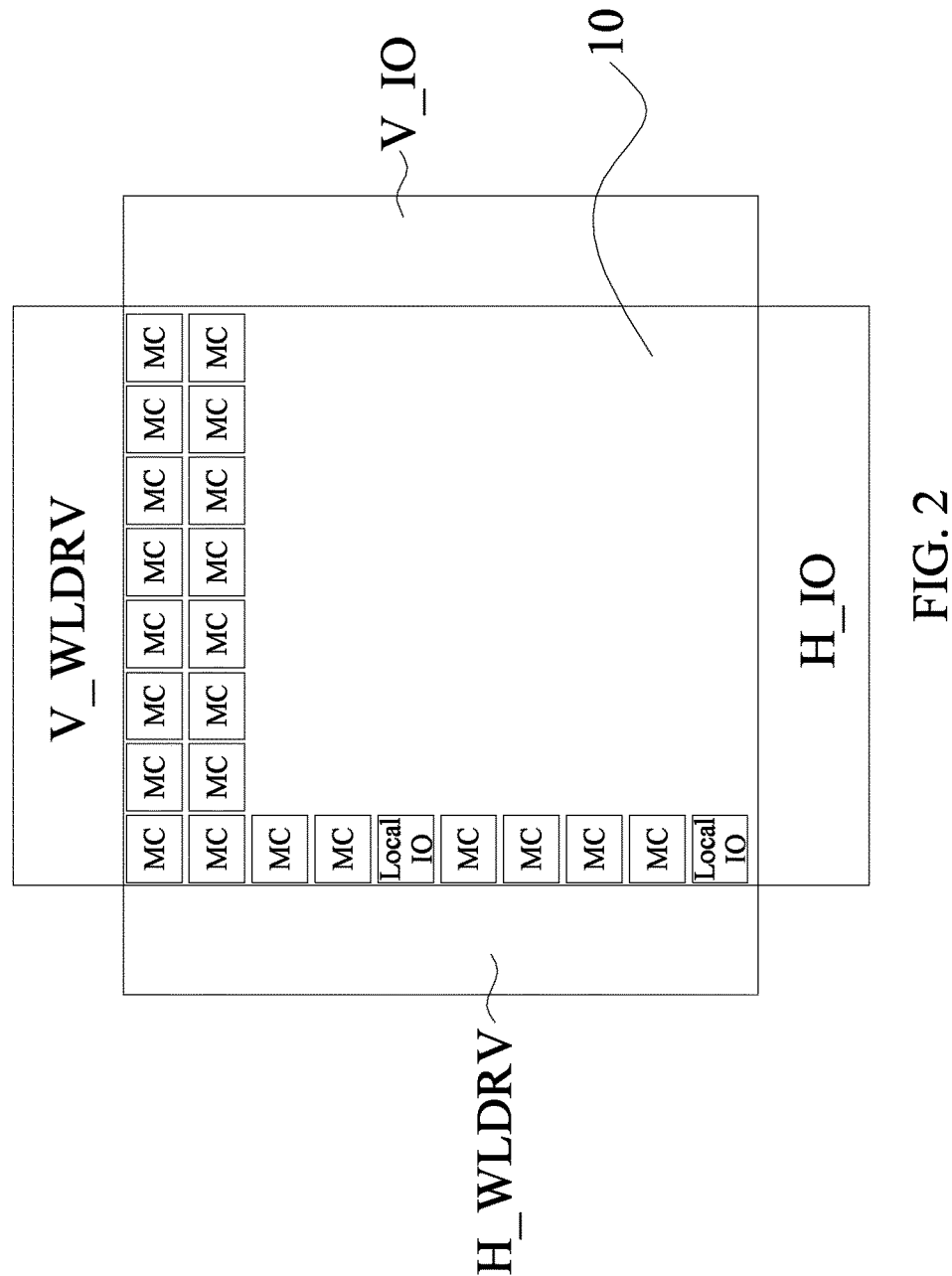
FIG. 2 is a diagram showing a configuration of a memory cell array region of FIG. 1 according to the present application.

FIG. 1 is a block diagram showing an entire configuration of a SRAM (static random access memory) as the memory device of an embodiment, and FIG. 2 is a diagram showing a configuration of a memory cell array region of FIG. 1 according to the present application. In the memory device 1 shown in FIGS. 1 and 2, there are provided a memory cell array region 10 including a large number of groups GP of SRAM memory cells arranged as a memory array. As shown in the figures, a plurality of local I/O circuits LIO is disposed between the groups GP in each row of the memory array. Specifically, the local I/O circuits LIO each coupled to one group of the plurality of local bit-lines in each row of the memory array. A vertical word-line driver V_WLDRV and a horizontal word-line driver H_WLDRV that are attached to the memory cell array region 10. The local bit-lines LBL in the memory cell array region 10 are coupled to the SRAM memory cells of each group GP, and as described later, the local bit-lines LBL are hierarchized into global bit-lines in different directions of an upper hierarchy and local bit-lines LBL of a lower hierarchy. The horizontal word-line driver H_WLDRV includes a plurality of word line driving circuits WLDRV provided corresponding to the plurality of word lines WL, and a plurality of local I/O control circuits CTRL LIO for controlling signals applied to the local I/O circuits LIO. Similarly, the vertical word-line driver V_WLDRV also includes a plurality of word line driving circuits WLDRV provided corresponding to the plurality of word lines WL.

Furthermore, a vertical I/O circuit V_IO and a horizontal I/O circuit H_IO are also attached to the memory cell array region 10, the vertical I/O circuit V_IO is connected to the plurality of horizontal global bit-lines HGBL, and the horizontal I/O circuit H_IO connected to the plurality of vertical global bit-lines VGBL. For controlling access mode of the memory device 1, a control circuit MainCTRL is provided and connected to the vertical word-line driver V_WLDRV, the horizontal word-line driver H_WLDRV, the vertical I/O circuit V_IO and the horizontal I/O circuit H_IO.

Although not show in the figures, the memory device 1 includes decoders disposed for the vertical word-line driver V_WLDRV and the horizontal word-line driver H_WLDRV, and the control circuit MainCTRL further includes a command decoder, which determines a command for the SRAM based on externally received control signals and sends the command to a control circuit MainCTRL. The control circuit MainCTRL controls operations of respective parts of the memory device 1 according to a command type determined by the command decoder. The control circuit MainCTRL outputs control signals for controlling later-described hierarchical switches provided in the local I/O circuit.

Please further refer to FIG. 2. In this embodiment, the memory cell array region 10 are provided with 8*8 memory array, which includes 8 memory cells MC for each row and column. The local I/O circuits LIO each coupled to one row of memory cells MC through the corresponding local bit-lines in each row of the memory array. In more detail, the global word-lines GBL each coupled to a first end of each of the local I/O circuits LIO, the horizontal global bit-lines HGBL each coupled to a second end of each of the local I/O circuits LIO, and the vertical global bit-lines VGBL coupled to a third end of each of the plurality of local I/O LIO. The structure of the memory cell MC and the local I/O will be described in more detail hereinafter.

Figure 3:
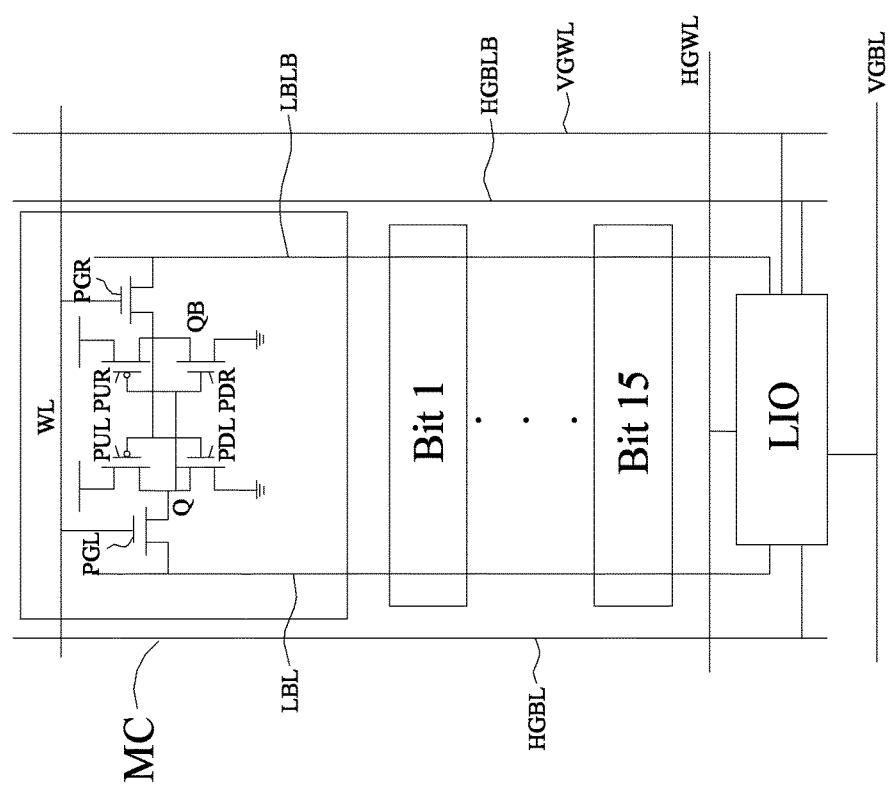
FIG. 3 is an enlarge diagram showing a configuration for single-end 6T SRAM of one group of the array region of FIG. 2 according to the present application.

The present application can also be provided by utilizing other types of SRAM. As shown in FIG. 3, which is an enlarge diagram showing a configuration for single-end 6T SRAM of one group of the array region of FIG. 2 according to the present application.

FIG. 3 is a diagram of a single ended 6 transistor (6T) memory cell MC that is an example of a memory cell that may be used in exemplary SRAMs herein. Other memory cells having different numbers of transistors, different configurations, and/or different components may be used, consistent with aspects of the present innovations. This example memory cell MC may store a bit on four transistors PUL, PUR, PDL, PDR that form two inverters. Access transistors PGL, PGR may control access to the storage transistors PUL, PUR, PDL, PDR during a read or write operation. A word-line WL may control the access transistors PGL, PGR and thereby connect the cell MC to the local bit-line LBL and complement bit-line LBLB. The local bit-line LBL and complement bit-line LBLB may transfer data to the local I/O circuit LIO and from the cell MC during read and write operations.

Moreover, the local I/O circuit LIO is further connected to a global vertical word-line VGWL with a first end, connected to a horizontal global bit-lines HGBL with a second end, connected to a horizontal global complement bit-line HGBLB with a third end, and connected to a horizontal global word-line HGWL with a fourth end, and similar arrangement are provided for each memory cells MC in each row of the memory array as shown in FIG. 2.

Figure 4:
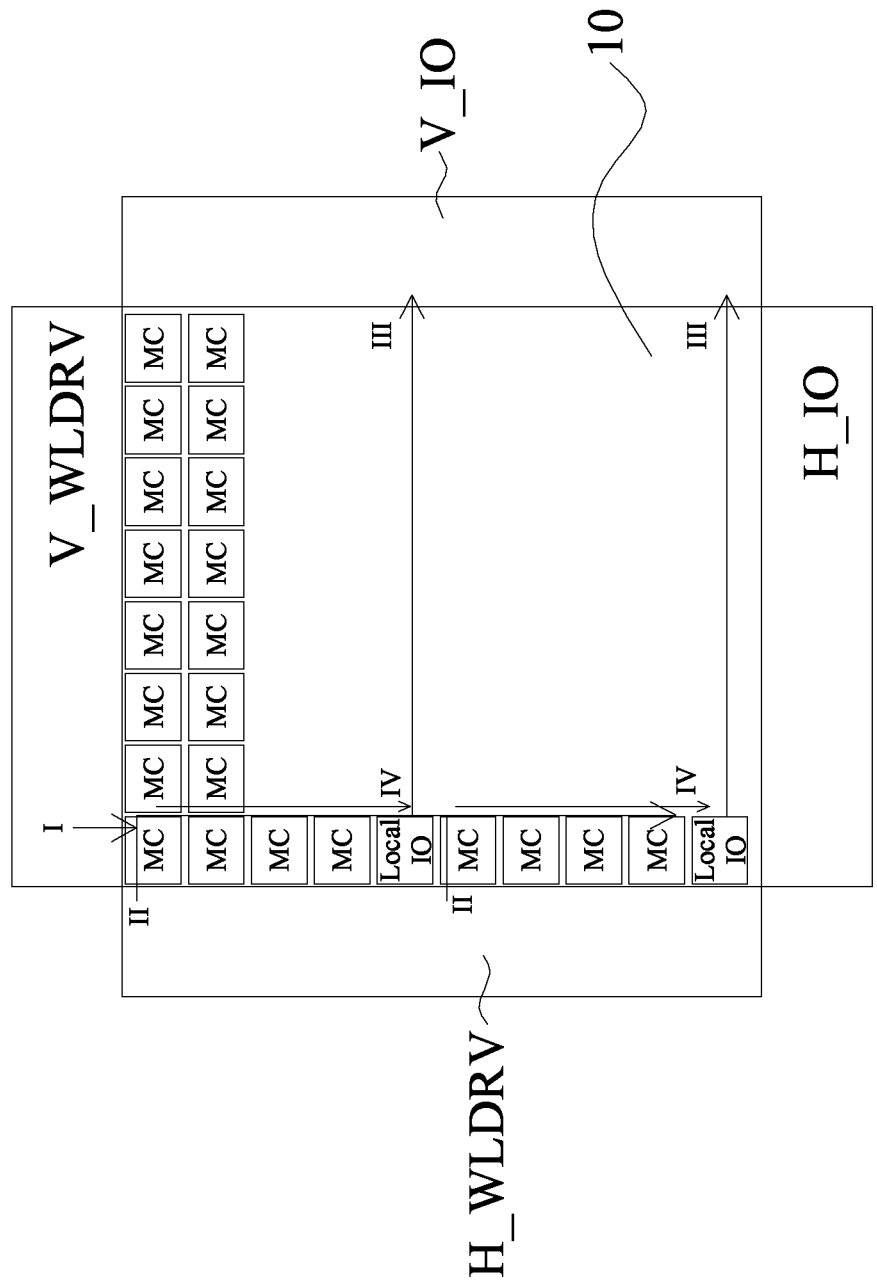
FIG. 4 is a diagram showing a configuration in the column access mode in FIG. 2 according to the present application
Figure 5:
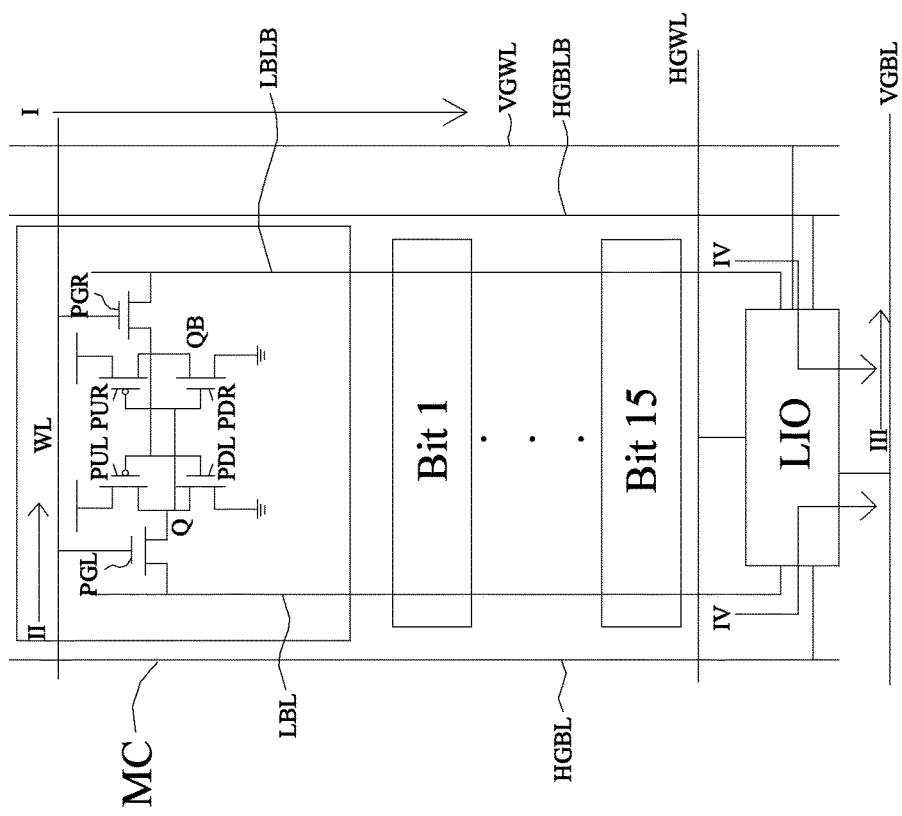
FIG. 5 is an enlarge diagram showing a column access mode configuration for single-end 6T SRAM of FIG. 3 according to the present application.

Please refer to FIGS. 4 and 5, FIG. 4 is a diagram showing a configuration in the column access mode in FIG. 2 according to the present application. FIG. 5 is an enlarge diagram showing a column access mode configuration for single-end 6T SRAM of FIG. 3 according to the present application.

In the column access mode, for example, as column read mode, the control circuit MainCTRL is configured to control the vertical word-line driver V_WLDRV to select a column to be read. More specifically, from the direction of the arrow I as depicted in FIGS. 4 and 5, the global vertical word-line VGBL is selected, such that the corresponding column can be selected to be read. In the meanwhile, the word-line WL of the selected row is simultaneously triggered to active the transistors PGL and PGR, as depicted in the direction of the arrow II. Secondly, the horizontal word-line driver H_WLDRV is configured to select which row of the selected column of the memory array to be read after the column is selected in the column access mode, by selecting the corresponding vertical global bit-line VGBL as the vertical global read bit-line VGRBL. For example, the horizontal word-line driver H_WLDRV is configured in 4 to 1 row selection, and as depicted in the direction of the arrow III.

In the operation, the data signal is output from the local bit-line LBL and local complement bit-line LBLB, to be used as a differential signal in the local I/O circuit LIO and is guided to the vertical global read bit-line VGBL through the local I/O circuit LIO, as shown by the arrow IV, and to be received by the 4 to 1 multiplexer of the vertical I/O circuit V_IO. Note that the horizontal global bit-line HGBL and the horizontal global complement bit-line HGBLB is served as the horizontal global read bit-line HGRBL and applied with the voltage VDD.

The transpose read structure of the present application again provides an efficient way to execute in the hardware level, in that the power can be saved on the unselected vertical global read word-lines, and the sensing margin can be increased, while providing better achieving transposed-SRAM without modifying the cell structure, that is, as illustrated in the embodiments, 8T and 6T SRAM cells are both suitable for the transpose accessing memory device.

Figure 6A:
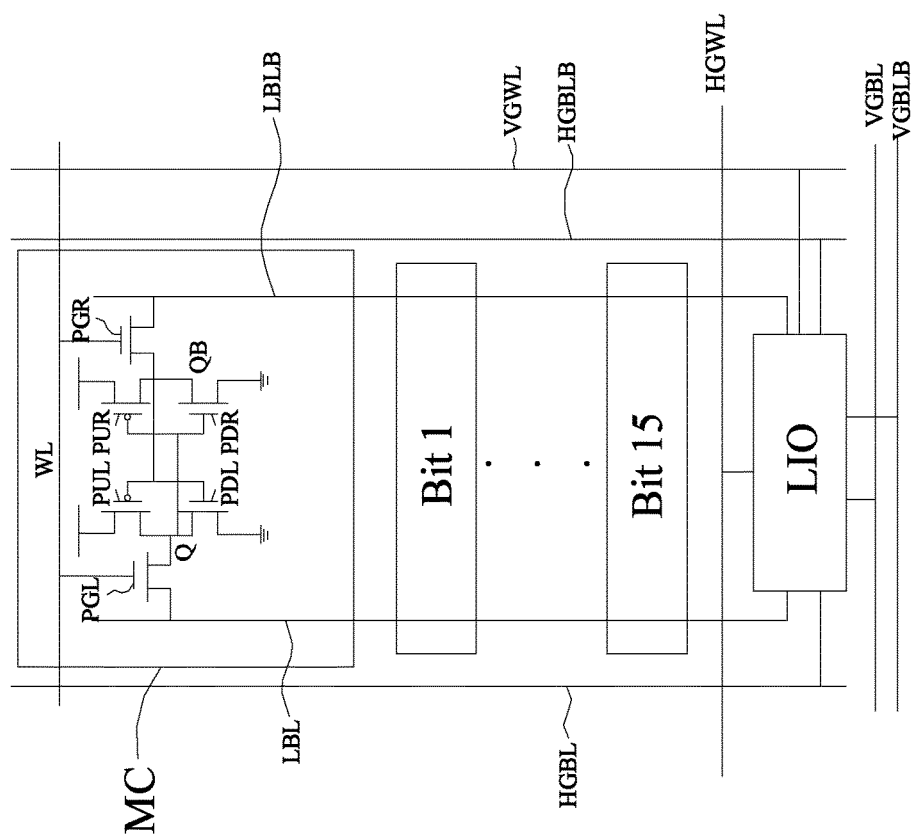
FIG. 6A to FIG. 6C are enlarge diagrams showing a configuration for differential-end 6T SRAM of one group of the array region of FIG. 4, and configurations operated in a normal mode and a transpose mode according to the present application.
Figure 6B:
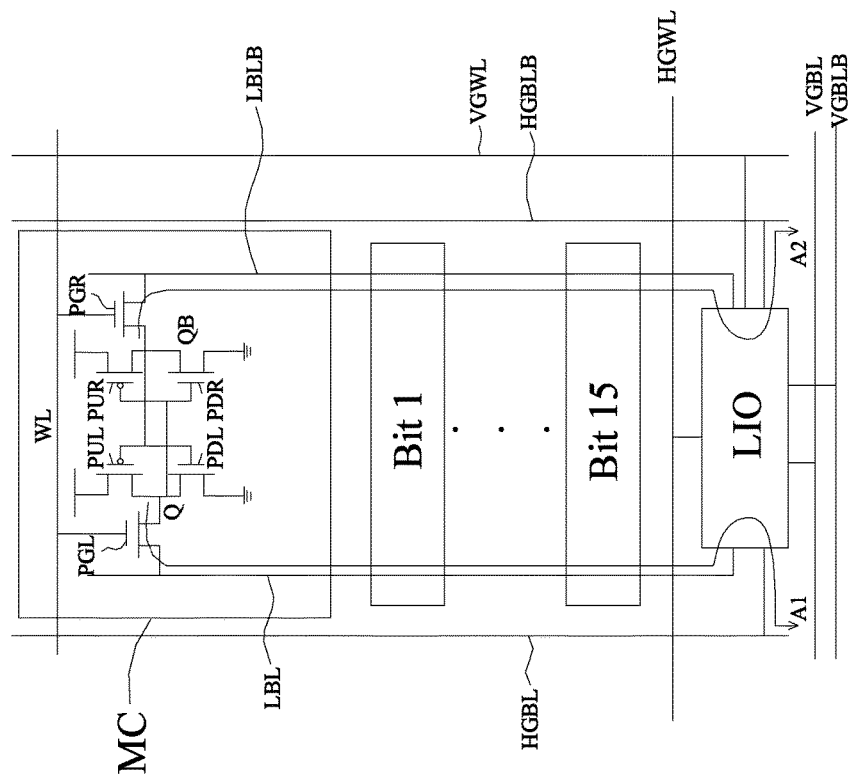
Figure 6C:
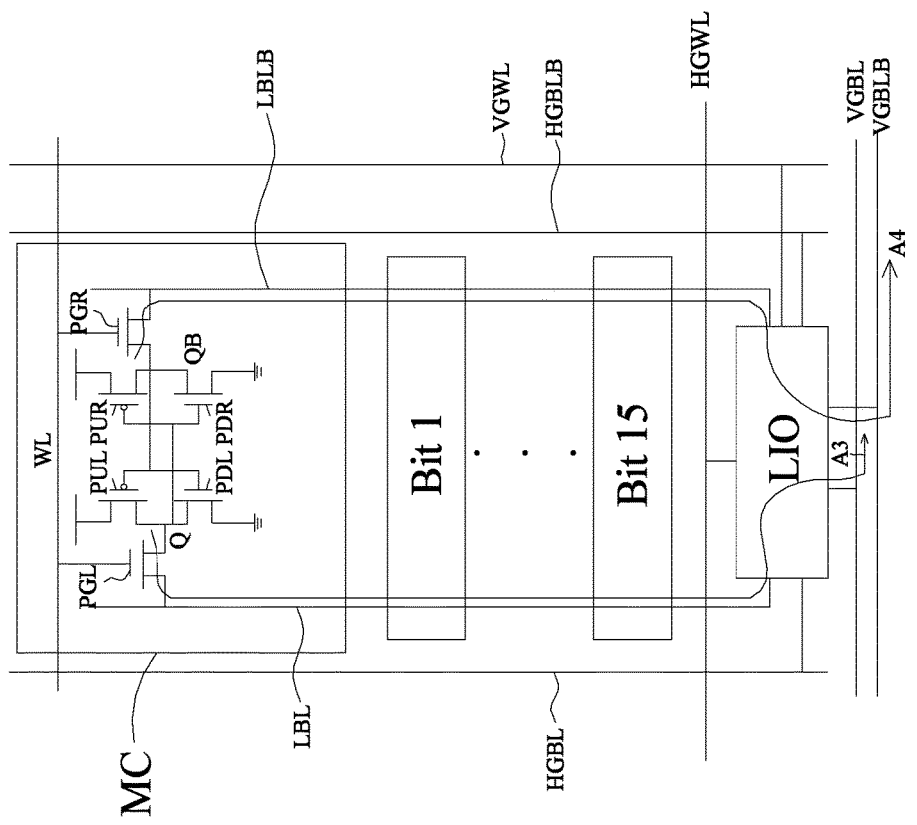
Figure 7A:
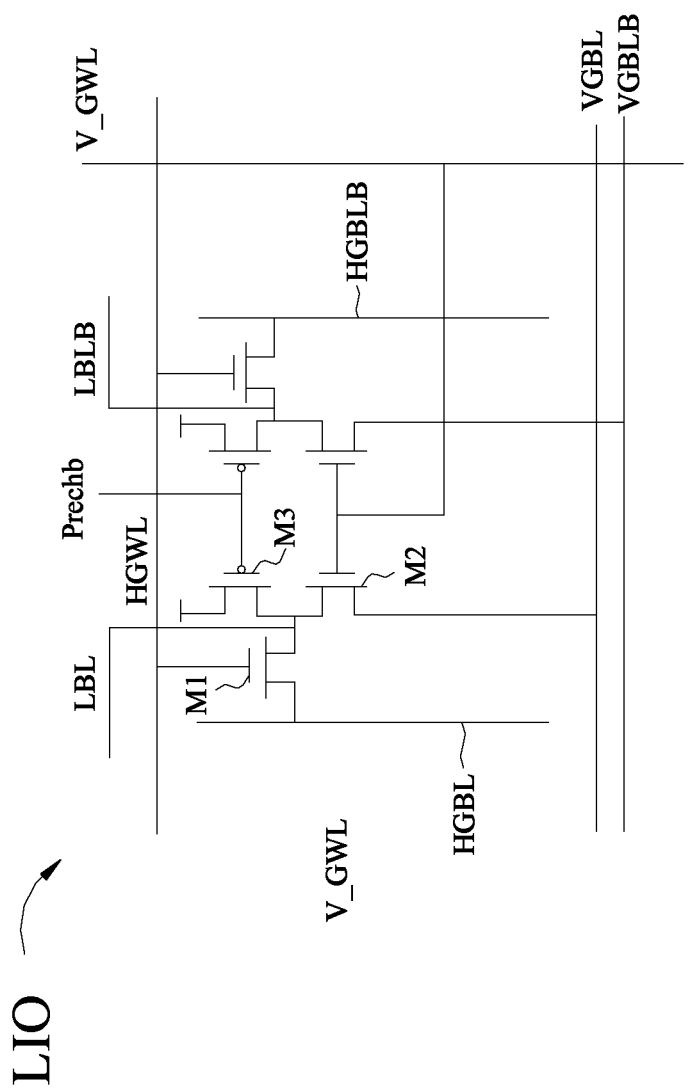
FIG. 7A is an enlarge diagram showing a configuration of the local I/O circuit of FIG. 6A according to the present application.

FIG. 6A to FIG. 6C are enlarge diagrams showing a configuration for differential-end 6T SRAM of one group of the array region of FIG. 4, and configurations operated in a normal mode and a transpose mode according to the present application. The structure of the memory cell MC for differential-end 6T SRAM is similar to the structure of FIG. 3, expect that a vertical global complement bit-line VGBLB is further connected to the local I/O circuit LIO. The detail arrangement of the local I/O circuit LIO is illustrated in FIG. 7A, which is an enlarge diagram showing a configuration of the local I/O circuit of FIG. 6A according to the present application. The local I/O circuit LIO includes a transistor M1 connecting to the horizontal global bit-line HGBL, and another transistor M2 connecting to vertical global bit-lines. The gate of the transistor M1 is controlled by the horizontal global word-lines HGWL, and the gate of the transistor M2 is controlled by the vertical global word-lines VGWL, such that the signals of the local bit-lines LBL can be selectively guided into the horizontal global bit-lines HGBL or the vertical global bit-lines VGBL in response to the command indicating the column access mode or the row access mode. Symmetric structure is utilized on another part of the local I/O circuit LIO for the local complement bit-line LBLB, thus the repeated descriptions are omitted. Furthermore, gates of the PMOS transistors M3 included in the local I/O circuit LIO is controlled by a precharge controlling terminal Prechb, those are independent from the gate controlling operation of transistors M1 and M2 and utilized to precharge the local bit-line LBL and local complementary bit-line LBLB.

In FIG. 6B, the horizontal global word-lines HGWL are activated, and the data may be accessed through the horizontal global bit-line HGBL and the horizontal global complement bit-line HGBLB in a normal mode, as shown by arrows A1 and A2. In FIG. 6C, the vertical global word-lines VGWL are activated, and the data may be accessed through the vertical global bit-line VGBL and the vertical global complement bit-line VGBLB in a transpose mode, as shown by arrows A3 and A4.

In the embodiments depicted in FIGS. 3 and 6A to 6C, merely a simple modification is need to provide the transpose accessing characteristic for the differential-end read or single-end read memory device without changing the structure of 6T cells.

Figure 7B:
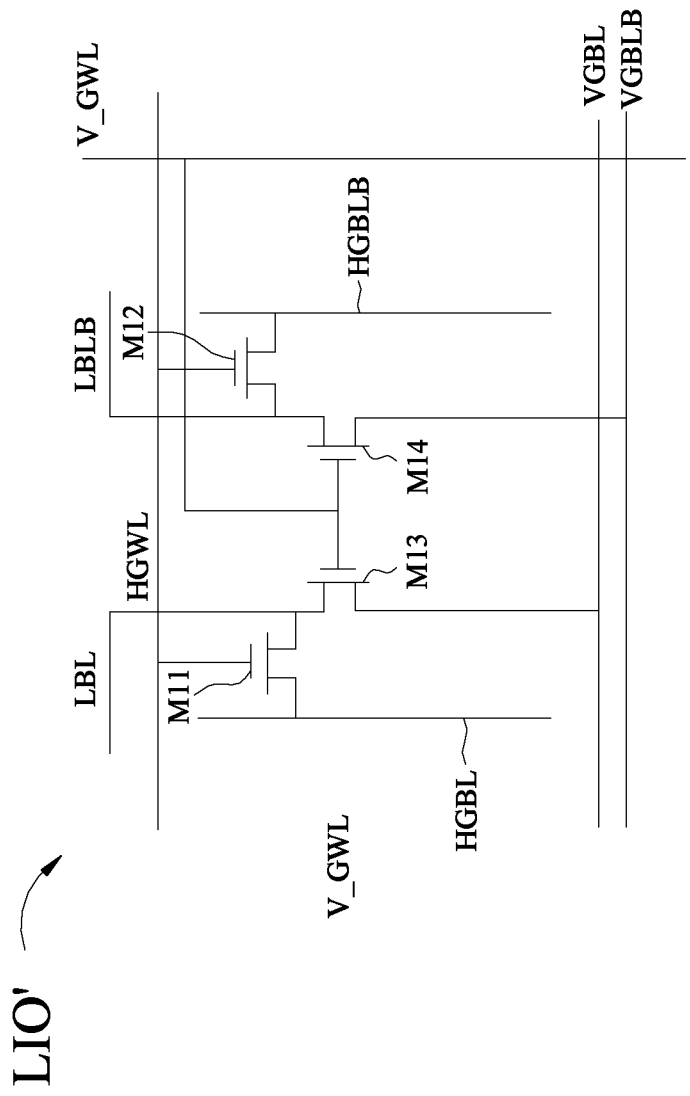
FIGS. 7B and 7C are another enlarge diagram and a circuit layout showing a configuration of the local I/O circuit of FIG. 6A according to the present application.
Figure 7C:
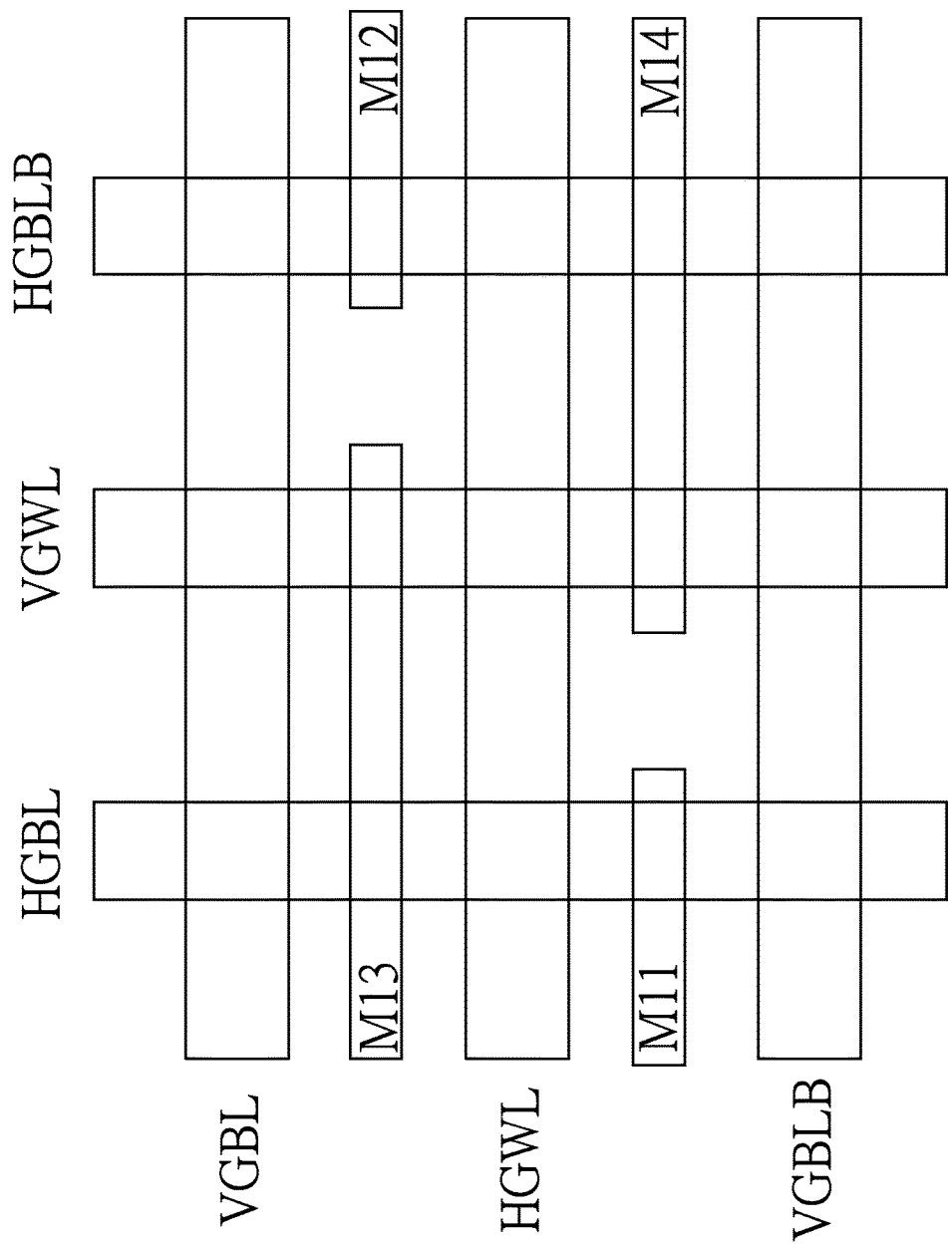

Please further refer to FIGS. 7B and 7C, which are another enlarge diagram and a circuit layout showing a configuration of the local I/O circuit of FIG. 6A according to the present application. In some embodiment, as illustrated in the detail arrangement of the local I/O circuit LIO' illustrated in FIG. 7B, the local I/O circuit LIO' includes a transistor M11 connecting to the horizontal global bit-line HGBL, a transistor M13 connecting to vertical global bit-line VGBL, a transistor M12 connecting to the horizontal global complement bit-line HGBLB, and a transistor M14 connecting to vertical global complement bit-line VGBLB. The gates of the transistors M11 and M12 are controlled by the horizontal global word-lines HGWL, and the gates of the transistors M13 and M14 are controlled by the vertical global word-lines VGWL, such that the signals of the local bit-lines LBL can be selectively guided into the horizontal global bit-lines HGBL or the vertical global bit-lines VGBL in response to the command indicating the column access mode or the row access mode. The transpose accessing memory may be fabricated in simple and space-saving ways according to the circuit layout provided in FIG. 7C. Furthermore, the symmetric structure is utilized on another part of the local I/O circuit LIO for the local complement bit-line LBLB, thus the repeated descriptions are omitted. Differently, the precharge controlling terminal Prechb provided in the previous embodiment is removed, therefore, the detailed controlling sequences are further provided hereinafter.

Figure 7D:
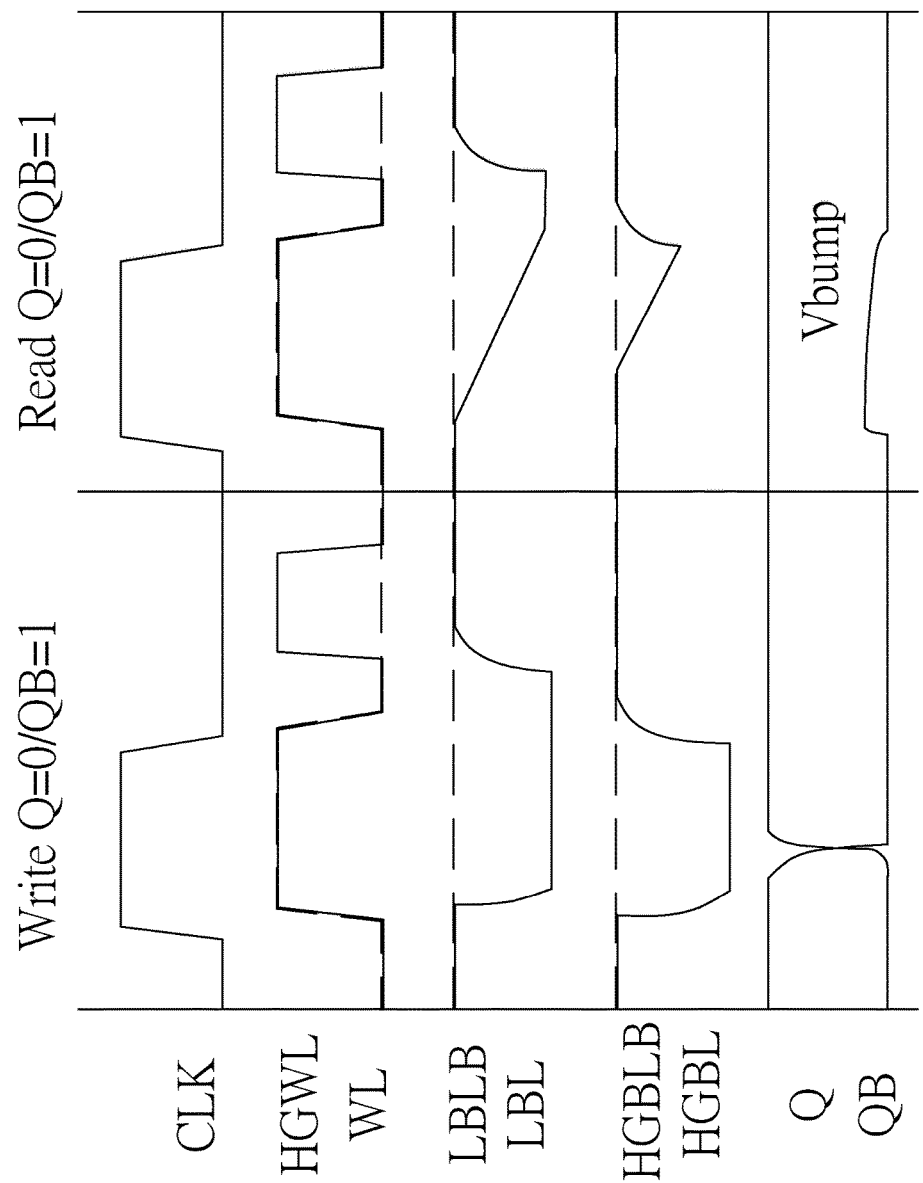
FIG. 7D is a diagram illustrating the signal timing when the transpose accessing memory in FIG. 7B operates in a normal mode according to an embodiment of the present application.
Figure 7E:
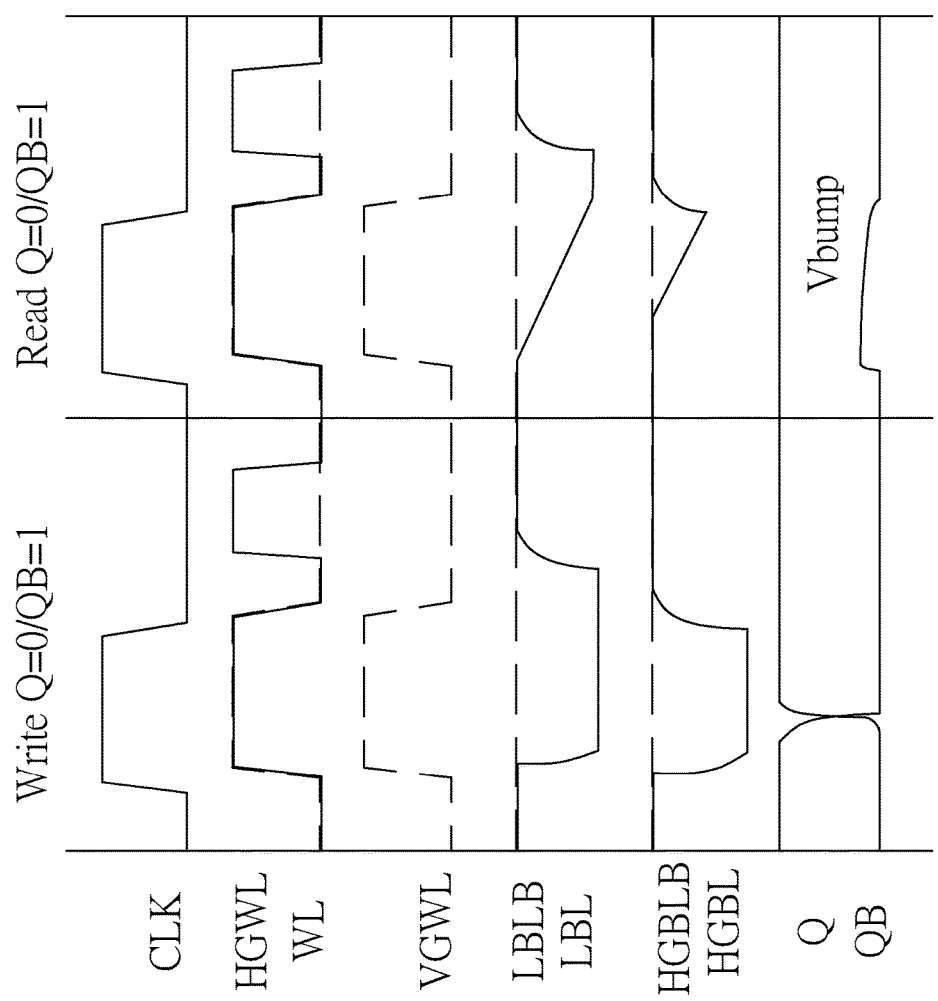
FIG. 7E is a diagram illustrating the signal timing when the transpose accessing memory in FIG. 7B operates in a transpose mode according to an embodiment of the present application.

Please refer to FIGS. 7D and 7E, FIG. 7D is a diagram illustrating the signal timing when the transpose accessing memory in FIG. 7B operates in a normal mode according to an embodiment of the present disclosure, and FIG. 7E is a diagram illustrating the signal timing when the transpose accessing memory in FIG. 7B operates in a transpose mode according to an embodiment of the present disclosure. The following discloses the transpose accessing memory cell while data are read as the signal changes with storage values variations for the first node Q and the second node QB. In the normal mode, the memory cell is addressed through the word-line WL, and the information is accessed through the local bit-lines LBL and/or local complement bit-line LBLB. Since the precharge controlling terminal Prechb provided in the previous embodiment is removed, a clock signal CLK is provided with the signal applied to the word-line WL, and the horizontal global word-line HGWL should be activated once more for charging the local bit-line LBL in the normal mode.

Similarly, in the transpose mode, the memory cell is addressed through the word-line WL, and the information is accessed through the local bit-lines LBL and/or local complement bit-line LBLB. Since the precharge controlling terminal Prechb provided in the previous embodiment is removed, a clock signal CLK is provided with the signal applied to the word-line WL, and the horizontal global word-line HGWL should be activated once more for charging the local bit-line LBL in the normal mode. Notably that the vertical global word-line VGWL should also be active once more in both writing and reading operations for the transpose accessing memory.

Figure 8:
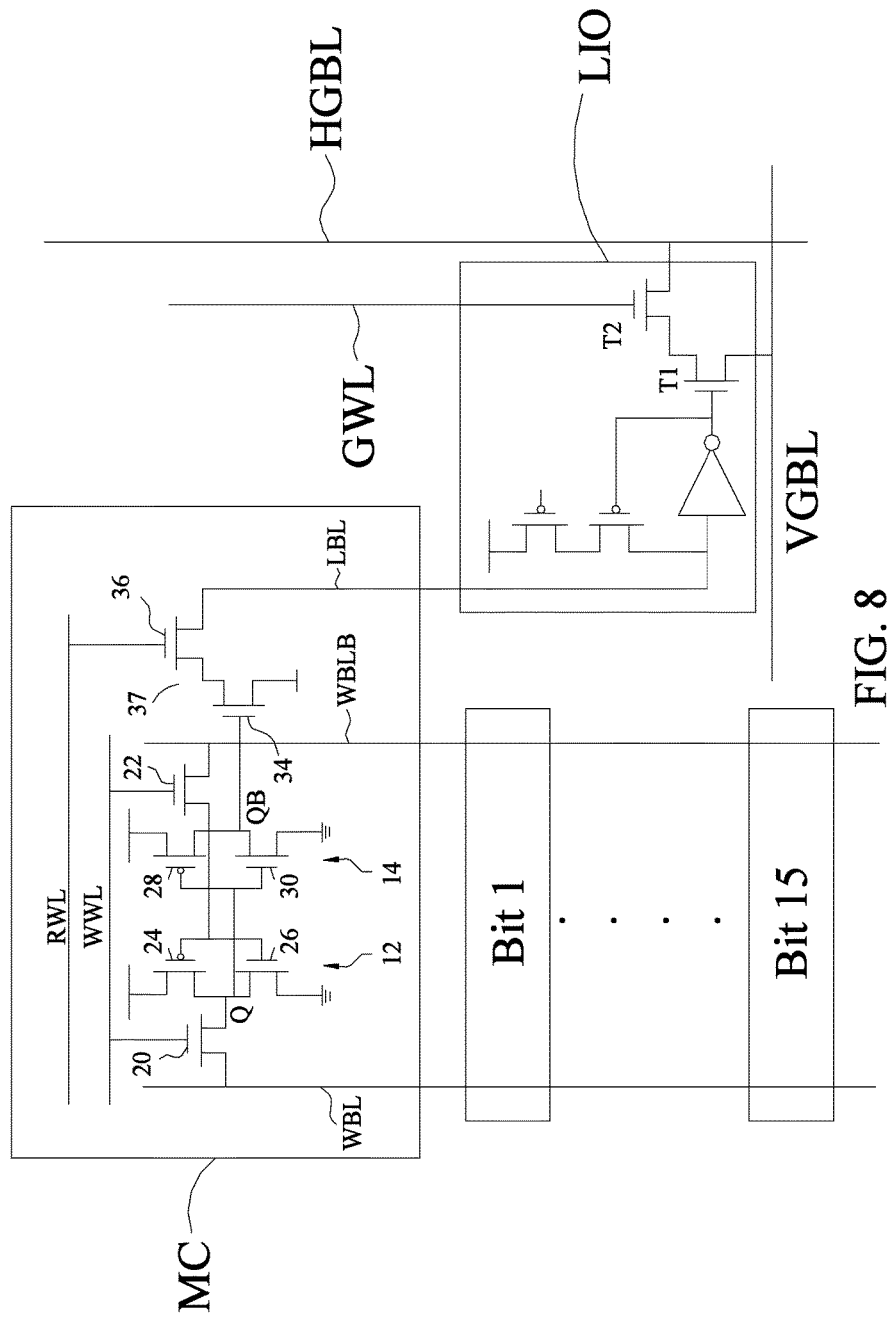
FIG. 8 is an enlarge diagram showing a configuration for 8T 2port SRAM of one group of the array region of FIG. 1 according to the present application.

FIG. 8 is an enlarge diagram showing a configuration for 8T 2port SRAM of one group of the array region of FIG. 1 according to the present application. Note that the 6-transistor (6T) memory cell and the 8-transistor (8T) memory cell may be used in embodiment(s) of the innovations herein. Specifically, the transpose read architecture of the present embodiment utilizes 2port 8T memory cell based on the hierarchical bit-line structure.

The 8T cell MC uses six transistors for a write operation and two transistors for a high performance read operation. The 8T cell has cross coupled inverters 12 and 14 that are respectively connected to write bit lines WBL and WBLB by access or pass-gate transistors 20 and 22. The inverter 12 has a PMOS transistor 24 and an NMOS transistor 26 connected between VCC and ground, and the inverter 14 has a PMOS transistor 28 and an NMOS transistor 30, also connected between VCC and ground. The gates of the PMOS transistor 24 and the NMOS transistor 26 of the inverter 12 are connected between the PMOS transistor 24 and an NMOS transistor 26 of the inverter 14. Likewise, the gates of the PMOS transistor 28 and the NMOS transistor 30 of the inverter 14 are connected between the PMOS transistor 24 and an NMOS transistor 26 of the inverter 14. The circuitry encircled by the dashed circle 32 is essentially a 6T bit cell (except that the lines designated as write bit lines WBL and WBLB would also be used for a read function in a 6T mode of operation). In the 8T bit cell illustrated a stack 37 of NMOS transistors 34 and 36 is connected between the node between the PMOS transistor 24 and an NMOS transistor 26 of the inverter 14 and the local bit-line LBL.

According to the embodiment of the present application, the plurality of local I/O circuits LIO includes a first part with an inverter connecting the local bit-line LBL to receive signals from the memory cell MC, and a second part with transistors selectively guiding the signals to the horizontal global bit-line HGBL or the vertical global bit-line VGBL in response to a select signals from the global word-line GWL. The local I/O circuit LIO includes a first transistor T1 and a second transistor T2 controlling an electrical connection between the corresponding local bit-line LBL and the corresponding vertical global bit-line VGBL in response to a signal applied to a gate of the second transistor T2 from the corresponding global word-line GWL.

Figure 9A:
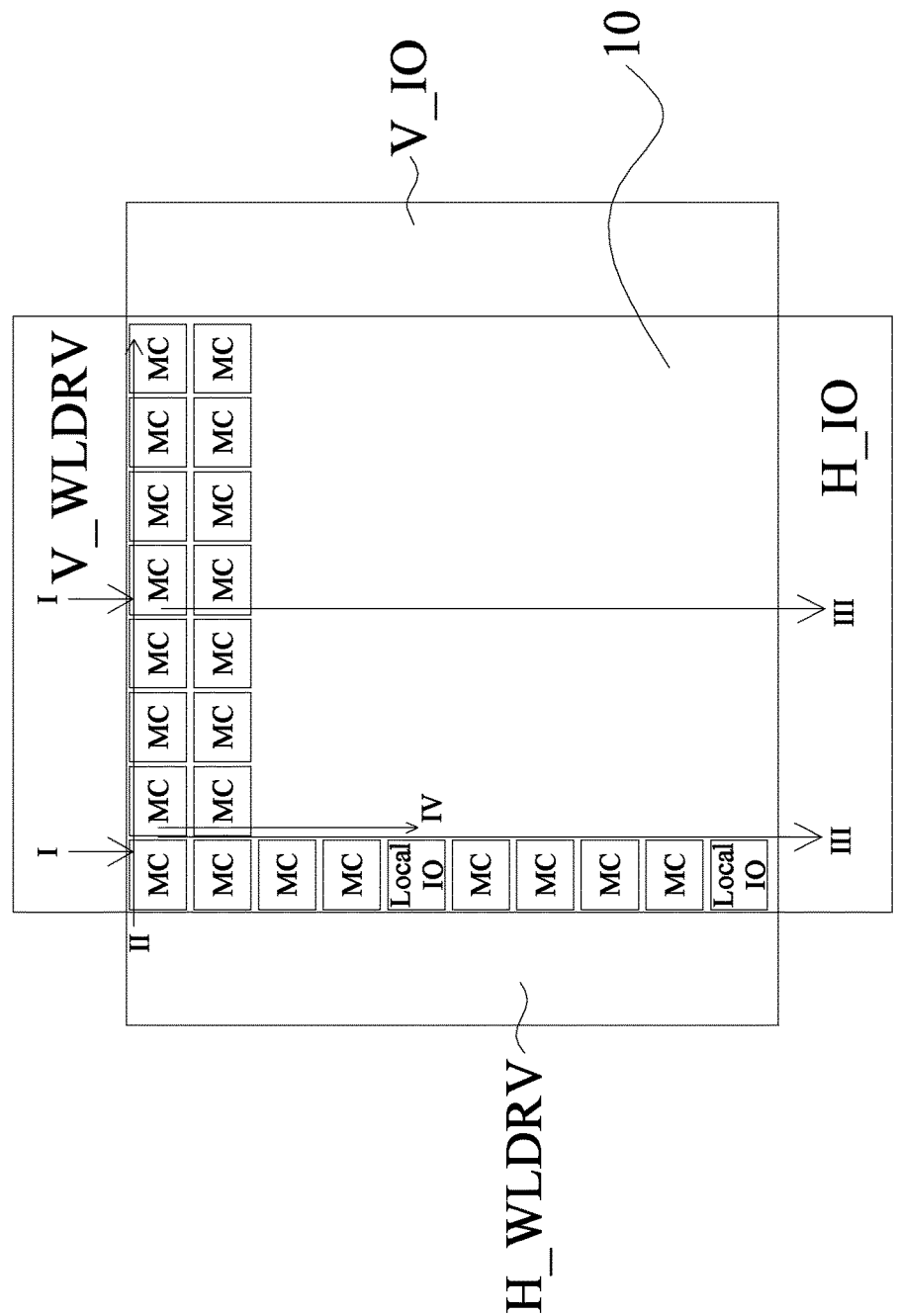
FIG. 9A is a diagram showing a configuration in the row access mode in FIG. 2 according to the present application.
Figure 9B:
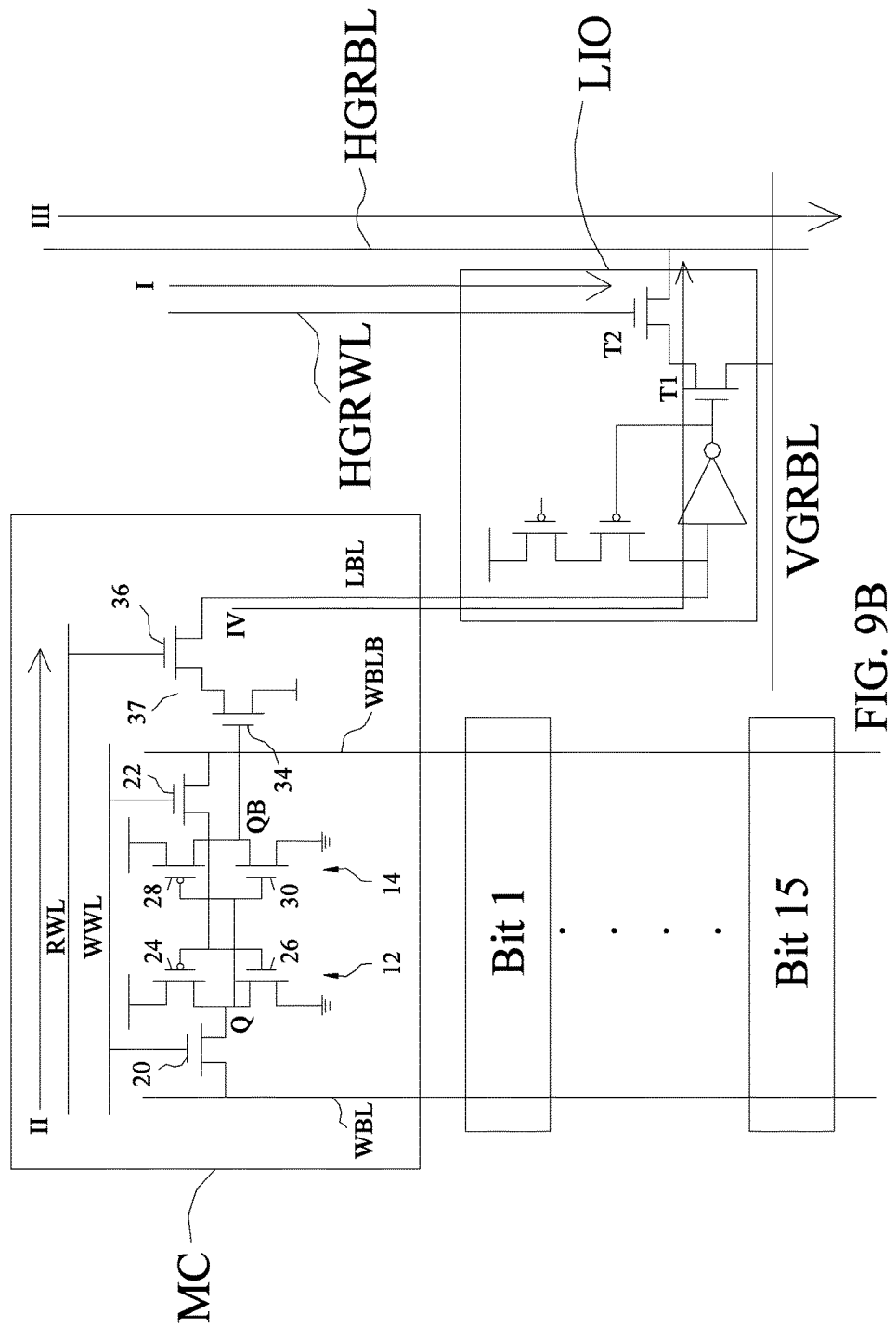
FIG. 9B is a diagram showing a configuration in the row access mode in FIG. 3 according to the present application.
Figure 9C:
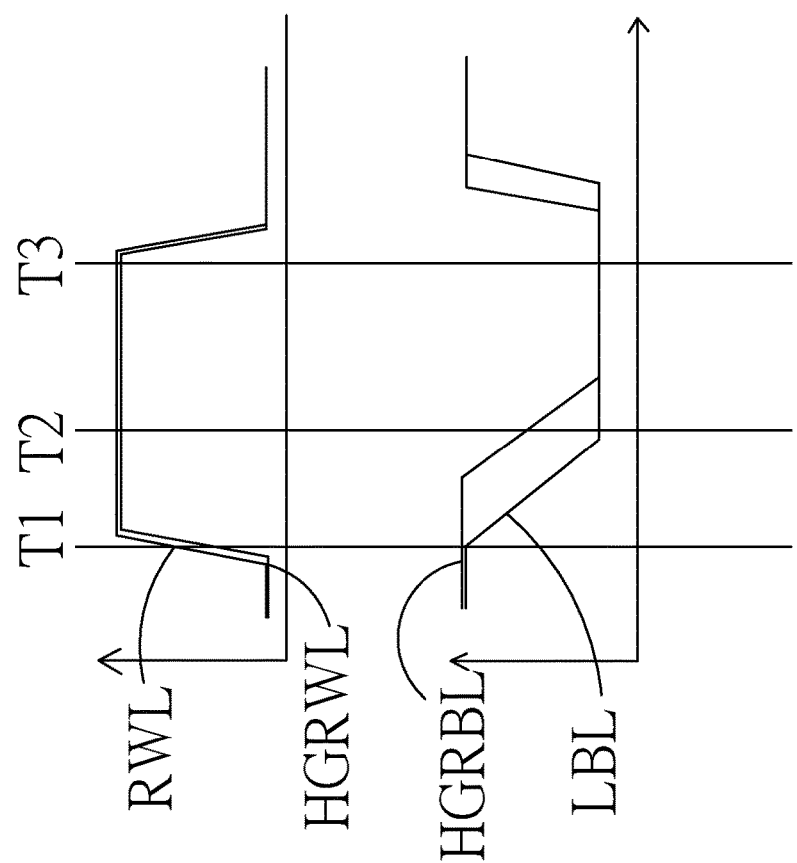
FIG. 9C is a diagram showing operation waveforms when performing the row access mode as FIG. 9A according to the present application.

FIG. 9A is a diagram showing a configuration in the row access mode in FIG. 2 according to the present application, FIG. 9B is a diagram showing a configuration in the row access mode in FIG. 8 according to the present application, FIG. 9C is a diagram showing operation waveforms when performing the row access mode as FIG. 9A according to the present application. The row access mode of the memory device 1 will now be described in more detail according to FIGS. 9A-9C of the present application.

In the row access mode, for example, as row read mode, the control circuit MainCTRL is configured to control the horizontal word-line driver H_WLDRV to select a row to be read. More specifically, from the direction of the arrow I as depicted in FIGS. 4A and 4B, the global word-line GBL is selected to be horizontal global read word-line HGRBL, such that the corresponding row can be selected to be read. In the meanwhile, the read word-line RWL of the selected row is simultaneously triggered to active the NMOS transistors 36, as depicted in the direction of the arrow II. Secondly, the vertical word-line driver V_WLDRV is configured to select which column of the selected row of the memory array to be read after the row is selected in the row access mode, by selecting the corresponding horizontal global bit-line HGBL as the horizontal global read bit-line HGRBL. For example, the vertical word-line driver V_WLDRV is configured in 4 to 1 column selection, and as depicted in the direction of the arrow III.

In the operation, the data signal is output from the local bit-line LBL, and is guided to the horizontal global read bit-line through the first transistor T1 and the second transistor T2, as shown by the arrow IV, and to be received by the 4 to 1 multiplexer of the horizontal I/O circuit H_IO. Note that the vertical global bit-line VGBL is served as the vertical global read bit-line VGRBL and applied with the voltage VSS.

As can be seen, the operation waveforms when performing the row access mode are illustrated in FIG. 9C. The data signal of the local bit-line LBL is read from the horizontal global read bit-line HGRBL, and the read word-line RWL and the horizontal global read word-line HGRBL are triggered in the same time region, as depicted by the times T1, T2 and T3. By utilizing the transpose read structure, the power can be saved on the unselected horizontal global read word-lines.

Figure 10A:
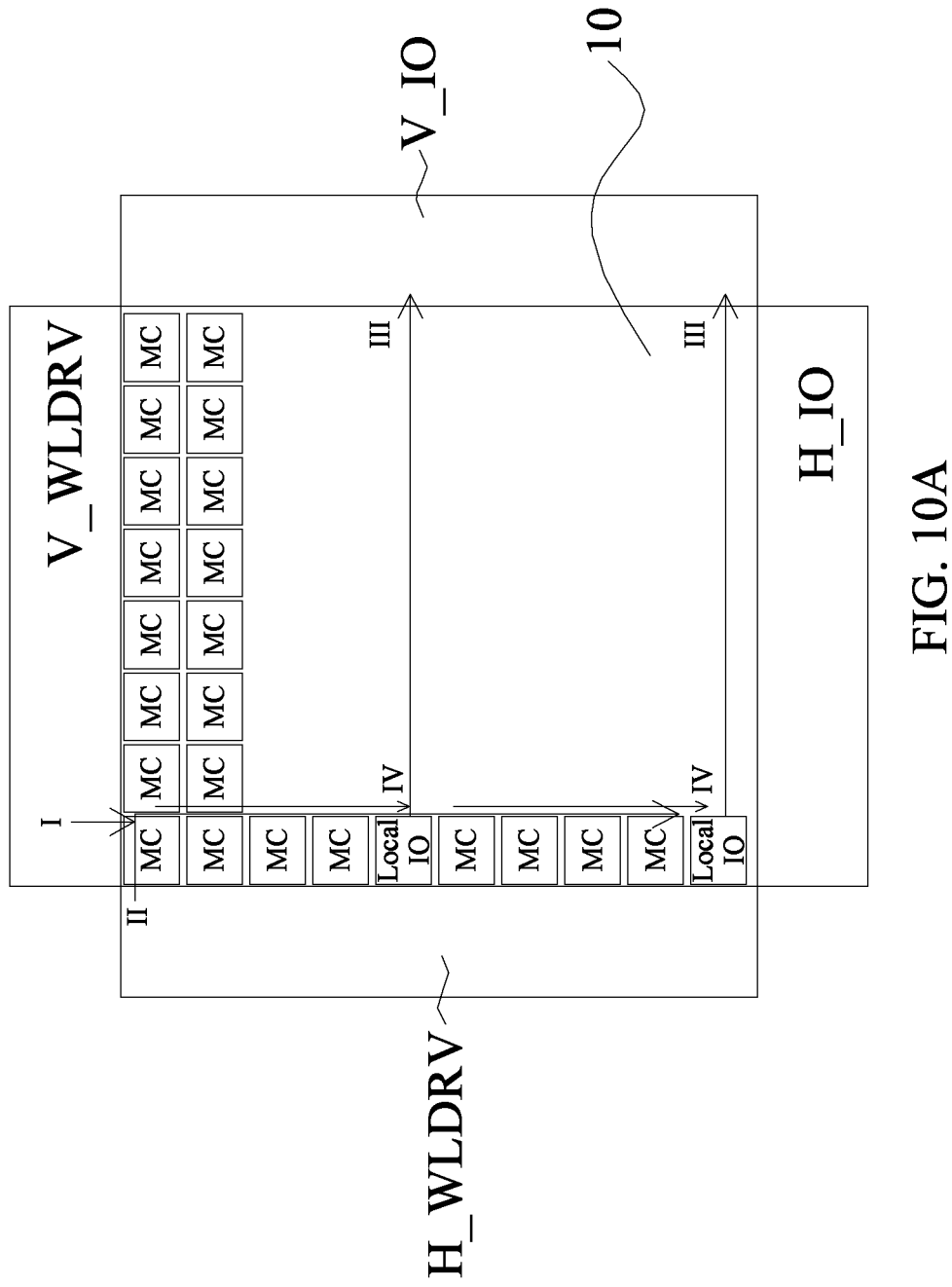
FIG. 10A is a diagram showing a configuration in the column access mode in FIG. 2 according to the present application.
Figure 10B:
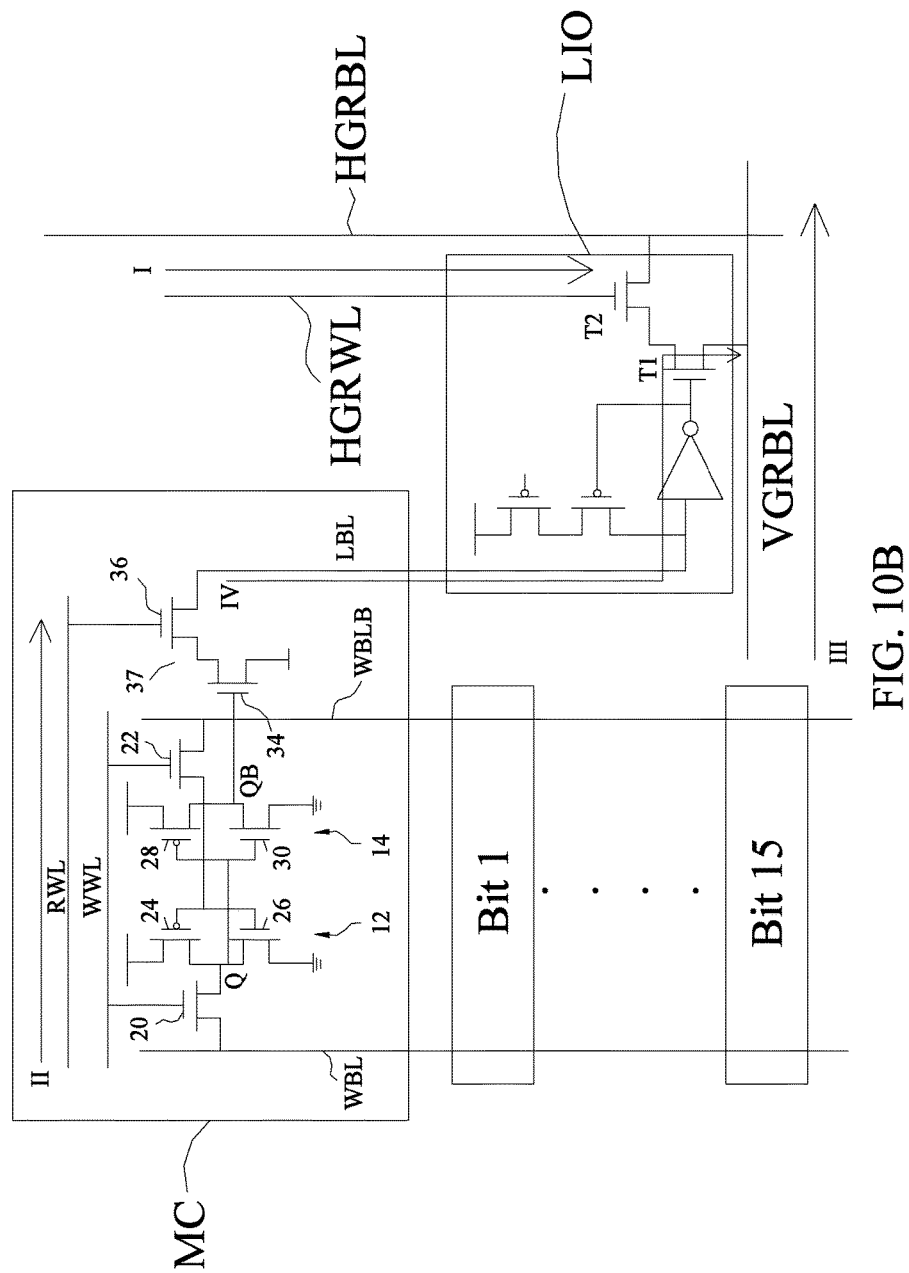
FIG. 10B is a diagram showing a configuration in the column access mode in FIG. 3 according to the present application.
Figure 10C:
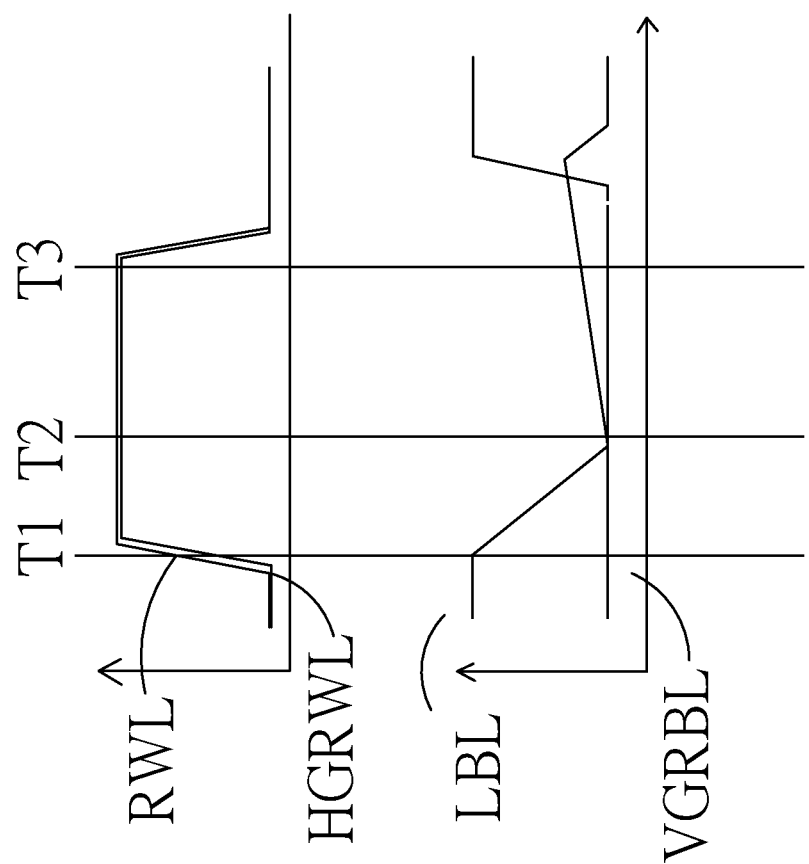
FIG. 10C is a diagram showing operation waveforms when performing the column access mode as FIG. 10B according to the present application.

FIG. 10A is a diagram showing a configuration in the column access mode in FIG. 2 according to the present application, FIG. 10B is a diagram showing a configuration in the column access mode in FIG. 8 according to the present application, and FIG. 10C is a diagram showing operation waveforms when performing the column access mode as FIG. 10B according to the present application.

In the column access mode, for example, as column read mode, the control circuit MainCTRL is configured to control the vertical word-line driver V_WLDRV to select a column to be read. More specifically, from the direction of the arrow I as depicted in FIGS. 5A and 5B, the global word-line GBL is selected to be vertical global read word-line VGRBL, such that the corresponding column can be selected to be read. In the meanwhile, the read word-line RWL of the selected row is simultaneously triggered to active the NMOS transistors 36, as depicted in the direction of the arrow II. Secondly, the horizontal word-line driver H_WLDRV is configured to select which row of the selected column of the memory array to be read after the column is selected in the column access mode, by selecting the corresponding vertical global bit-line VGBL as the vertical global read bit-line VGRBL. For example, the horizontal word-line driver H_WLDRV is configured in 4 to 1 row selection, and as depicted in the direction of the arrow III.

In the operation, the data signal is output from the local bit-line LBL, and is guided to the vertical global read bit-line through the first transistor T1 and the second transistor T2, as shown by the arrow IV, and to be received by the 4 to 1 multiplexer of the vertical I/O circuit V_IO. Note that the horizontal global bit-line HGBL is served as the horizontal global read bit-line HGRBL and applied with the voltage VDD.

As can be seen, the operation waveforms when performing the row access mode are illustrated in FIG. 10C. The data signal of the local bit-line LBL is read from the vertical global read bit-line HGRBL, and the read word-line RWL and the vertical global read word-line VGRBL are triggered in the same time region, as depicted by the times T1, T2 and T3. The transpose read structure of the present application provides an efficient way to execute in the hardware level, in that the power can be saved on the unselected vertical global read word-lines, and the sensing margin can be increased, while providing better achieving transposed-SRAM without modifying the cell structure. Furthermore, series of rows won't have to be read if the data stored in the column is needed to be read, such that the energy-saving, time-saving and area-efficient characteristics can be achieved.

Figure 11:
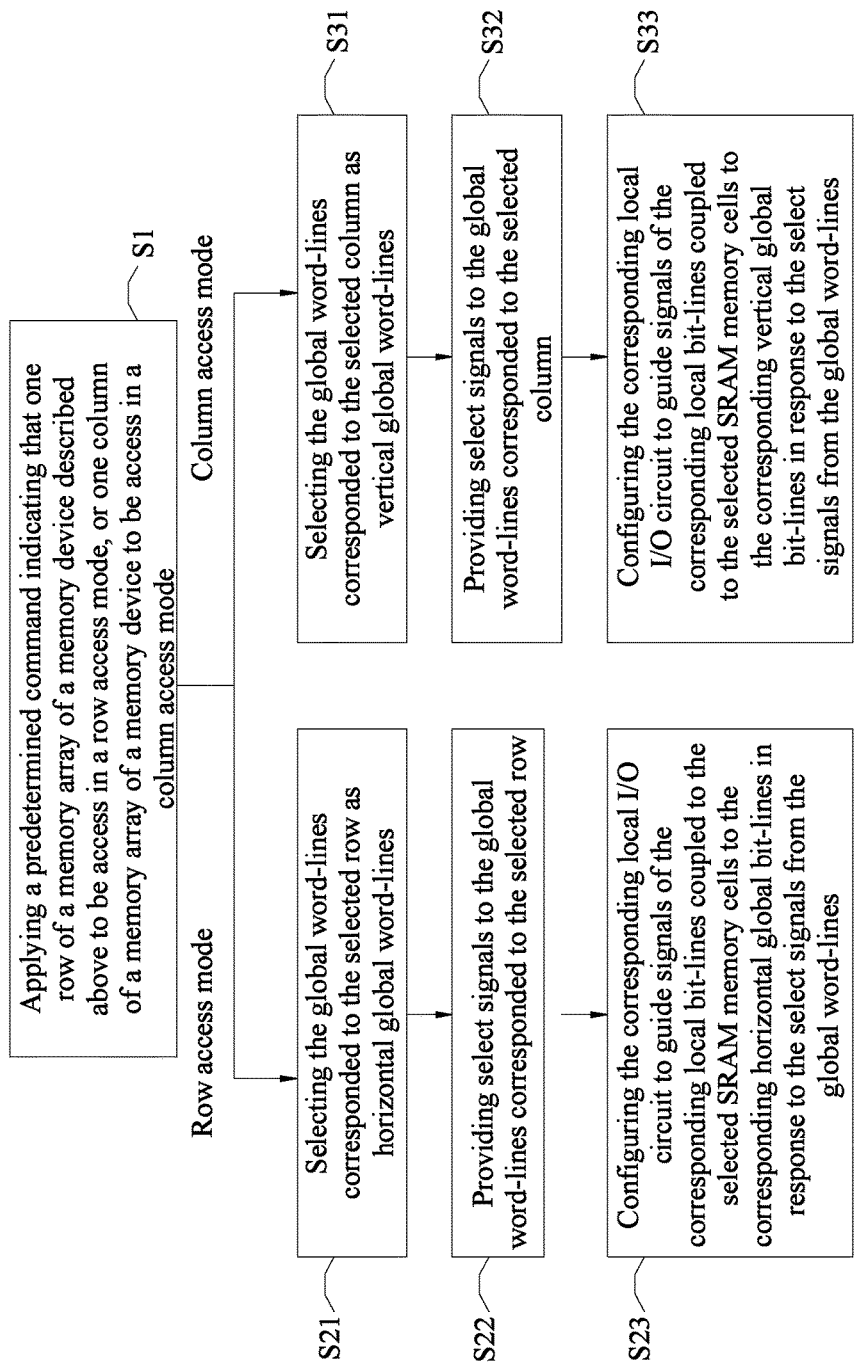
FIG. 11 provides a flow chart of a transpose accessing method for a memory device according to an embodiment of the present application.

FIG. 11 provides a flow chart of a transpose accessing method for a memory device according to an embodiment of the present application.

The method includes the following steps:

Step S1: Applying a predetermined command indicating that one row of a memory array of a memory device described above to be access in a row access mode, or one column of a memory array of a memory device to be access in a column access mode.

If at least one row of the memory array is selected to be access in the row access mode, further proceeds to the following steps S21, S22 and S23.

Step S21: Selecting the global word-lines corresponded to the selected row as horizontal global word-lines.

Step S22: Providing select signals to the global word-lines corresponded to the selected row.

Step S23: Configuring the corresponding local I/O circuit to guide signals of the corresponding local bit-lines coupled to the selected SRAM memory cells to the corresponding horizontal global bit-lines in response to the select signals from the global word-lines.

If at least one column of the memory array is selected to be access in the column access mode, further proceeds to the following steps S31, S32 and S33.

Steps S31: Selecting the global word-lines corresponded to the selected column as vertical global word-lines.

Steps S32: Providing select signals to the global word-lines corresponded to the selected column.

Steps S33: Configuring the corresponding local I/O circuit to guide signals of the corresponding local bit-lines coupled to the selected SRAM memory cells to the corresponding vertical global bit-lines in response to the select signals from the global word-lines.

From above, the transpose accessing structure and method of the present application provides an efficient way to execute in the hardware level, in that the power can be saved on the unselected vertical global read word-lines, and the sensing margin can be increased, while providing better achieving transposed-SRAM without modifying the cell structure. Furthermore, series of rows won't have to be read if the data stored in the column is needed to be read, such that the energy-saving, time-saving and area-efficient characteristics can be achieved.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A transpose accessing memory device comprising:
    a plurality of groups of SRAM memory cells, arranged as a memory array;
    a plurality of local bit-lines, coupled to the SRAM memory cells of each group of the plurality of groups;
    a plurality of local I/O circuits, each coupled to one group of the plurality of local bit-lines in each row of the memory array;
    a plurality of global word-lines, each coupled to a first end of each of the plurality of local I/O circuits, respectively;
    a plurality of horizontal global bit-lines, each coupled to a second end of each of the plurality of local I/O circuits, respectively; and
    a plurality of vertical global bit-lines, coupled to a third end of each of the plurality of local I/O, respectively;
    wherein the global word-lines are configured to be selected as horizontal word-lines in a row access mode such that at least one row of the memory array is selected to be accessed, and the corresponding local I/O circuit is configured to guide signals of the local bit-lines coupled to the selected SRAM memory cells to the corresponding horizontal global bit-lines in response to select signals from the global word-lines;
    wherein the global word-lines are configured to be selected as vertical word-lines in a column access mode such that at least one column of the memory array is selected to be accessed, and the corresponding local I/O circuit is configured to guide signals of the local bit-lines coupled to the selected SRAM memory cells to the corresponding vertical global bit-lines in response to select signals from the global word-lines.

2. The transpose accessing memory device of claim 1, further comprising:
    a vertical word-line driver, connected to the plurality of global word-lines and configured to select which column of the memory array to be read in the column access mode;

a horizontal word-line driver, connected to the plurality of global word-lines and configured to select which row of the memory array to be read in the row access mode;

a vertical I/O circuit, connected to the plurality of horizontal global bit-lines and configured to access the SRAM memory cells of the selected row in the row access mode; and a horizontal I/O circuit, connected to the plurality of vertical global bit-lines and configured to access the SRAM memory cells of the selected column in the column access mode.

3. The transpose accessing memory device of claim 2, wherein the vertical word-line driver is configured to select which column of the selected row of the memory array to be read after the row is selected in the row access mode, and wherein the horizontal word-line driver is configured to select which row of the selected column of the memory array to be read after the column is selected in the column access mode.

4. The transpose accessing memory device of claim 3, further comprising a control circuit connected to the vertical word-line driver, the horizontal word-line driver, the vertical I/O circuit and the horizontal I/O circuit, wherein the control circuit is configured to bring the vertical word-line driver and the horizontal word-line driver into the row access mode or the column access mode in response to a predetermined command, and configured to activate the vertical I/O circuit and the horizontal I/O circuit after bringing the vertical word-line driver and the horizontal word-line driver into the row access mode or the column access mode in response to the predetermined command.

5. The transpose accessing memory device of claim 1, wherein the SRAM memory cells is 8T 2port SRAM or 6T SRAM.

6. The transpose accessing memory device of claim 1, wherein each of the plurality of local I/O circuits includes a first transistor and a second transistor controlling an electrical connection between the corresponding local bit-line and the corresponding vertical global bit-line in response to a signal applied to a gate of the second transistor from the corresponding global word-line.

7. The transpose accessing memory device of claim 1, wherein each of the local I/O circuits comprises a local sense amplifier.

8. The transpose accessing memory device of claim 7, further comprising:

a plurality of local complement bit-lines, coupled to the SRAM memory cells of each group of the plurality of groups, wherein the plurality of local I/O circuits each is coupled to one group of the plurality of local bit-lines in each row of the memory array;

a plurality of horizontal complement global bit-lines, each coupled to a fourth end of each of the plurality of local I/O circuits, respectively; and a plurality of vertical complement global bit-lines, coupled to a fifth end of each of the plurality of local I/O, respectively.

9. A transpose accessing method for a memory device, the method comprising:

applying a predetermined command indicating that one row of a memory array of a memory device to be accessed in a row access mode, or one column of a memory array of a memory device to be accessed in a column access mode, the memory device comprising:

a plurality of groups of SRAM memory cells, arranged as the memory array;

a plurality of local bit-lines, coupled to the SRAM memory cells of each group of the plurality of groups;

a plurality of local I/O circuits, each coupled to one group of the plurality of local bit-lines in one row of the memory array;

a plurality of global word-lines, each coupled to a first end of each of the plurality of local I/O circuits, respectively;

a plurality of horizontal global bit-lines, each coupled to a second end of each of the plurality of local I/O circuits, respectively; and a plurality of vertical global bit-lines, coupled to a third end of each of the plurality of local I/O, respectively;

when at least one row of the memory array is selected to be accessed in the row access mode, the transpose accessing method further comprises:

selecting the global word-lines corresponded to the selected row as horizontal global word-lines;

providing select signals to the global word-lines corresponded to the selected row; and configuring the corresponding local I/O circuit to guide signals of the corresponding local bit-lines coupled to the selected SRAM memory cells to the corresponding horizontal global bit-lines in response to the select signals from the global word-lines;

when at least one column of the memory array is selected to be accessed in the column access mode, the transpose accessing method further comprises:

selecting the global word-lines corresponded to the selected column as vertical global word-lines;

providing select signals to the global word-lines corresponded to the selected column; and configuring the corresponding local I/O circuit to guide signals of the corresponding local bit-lines coupled to the selected SRAM memory cells to the corresponding vertical global bit-lines in response to the select signals from the global word-lines.

10. The method of claim 9, further comprising:

configuring a vertical word-line driver connected to the plurality of global word-lines to select which column of the memory array to be read in the column access mode;

configuring a horizontal word-line driver connected to the plurality of global word-lines to select which row of the memory array to be read in the row access mode;

configuring a vertical I/O circuit connected to the plurality of horizontal global bit-lines to access the SRAM memory cells of the selected row in the row access mode; and configuring a horizontal I/O circuit connected to the plurality of vertical global bit-lines to access the SRAM memory cells of the selected column in the column access mode.

11. The method of claim 10, further comprising:

configuring the horizontal word-line driver to select which column of the selected row of the memory array to be read after the row is selected in the row access mode; and configuring the horizontal word-line driver to select which row of the selected column of the memory array to be read after the column is selected in the column access mode.

12. The method of claim 11, further comprising:

configuring a control circuit connected to the vertical word-line driver, the horizontal word-line driver, the vertical I/O circuit and the horizontal I/O circuit to bring the vertical word-line driver and the horizontal word-line driver into the row access mode or the column access mode in response to the predetermined command; and configuring the control circuit to activate the vertical I/O circuit and the horizontal I/O circuit after bringing the vertical word-line driver and the horizontal word-line driver into the row access mode or the column access mode in response to the predetermined command.

13. The method of claim 9, wherein the SRAM memory cells is 8T 2port SRAM or 6T SRAM.

14. The method of claim 9, further comprising:

configuring a first transistor and a second transistor in each of the plurality of local I/O circuits to control an electrical connection between the corresponding local bit-line and the corresponding vertical global bit-line in response to the select signal applied to a gate of the second transistor from the corresponding global word-line.

15. The method of claim 9, wherein each of the local I/O circuits comprises a local sense amplifier.

16. The method of claim 15, further comprising:

configuring the corresponding local I/O circuit to guide signals of a plurality of local complement bit-lines coupled to the selected SRAM memory cells to a plurality of horizontal complement global bit-lines each coupled to a fourth end of each of the plurality of local I/O circuits in response to the select signals from the global word-lines in the row access mode; or configuring the corresponding local I/O circuit to guide signals of a plurality of local complement bit-lines coupled to the selected SRAM memory cells to a plurality of vertical complement global bit-lines each coupled to a fifth end of each of the plurality of local I/O circuits in response to the select signals from the global word-lines in the column access mode.

* * * * *